US011460600B2

(12) United States Patent
Edwards et al.

(10) Patent No.: US 11,460,600 B2
(45) Date of Patent: Oct. 4, 2022

(54) THROUGH-BIT RECONFIGURABLE NMR LOGGING TOOL

(71) Applicants: Carl M. Edwards, Katy, TX (US); Marc Stephen Ramirez, Missouri City, TX (US); Otto Fanini, Houston, TX (US); Stanislav Forgang, Houston, TX (US)

(72) Inventors: Carl M. Edwards, Katy, TX (US); Marc Stephen Ramirez, Missouri City, TX (US); Otto Fanini, Houston, TX (US); Stanislav Forgang, Houston, TX (US)

(73) Assignee: BAKER HUGHES OILFIELD OPERATIONS LLC, Houston, TX (US)

( * ) Notice: Subject to any disclaimer, the term of this patent is extended or adjusted under 35 U.S.C. 154(b) by 3 days.

(21) Appl. No.: 17/015,872

(22) Filed: Sep. 9, 2020

(65) Prior Publication Data

US 2022/0075090 A1    Mar. 10, 2022

(51) Int. Cl.
*G01V 3/32* (2006.01)
*G01R 33/38* (2006.01)
(Continued)

(52) U.S. Cl.
CPC ......... *G01V 3/32* (2013.01); *G01R 33/34076* (2013.01); *G01R 33/3621* (2013.01); *G01R 33/383* (2013.01); *G01R 33/3808* (2013.01)

(58) Field of Classification Search
CPC ............... G01V 3/32; G01R 33/34076; G01R 33/3621; G01R 33/3808; G01R 33/383
See application file for complete search history.

(56) References Cited

U.S. PATENT DOCUMENTS 5,914,598 A    6/1999  Sezginer et al.
7,295,005 B2 *  11/2007  Edwards ............ G01V 3/32
                                              324/303
(Continued)

FOREIGN PATENT DOCUMENTS

CA    2943982 A1    12/2015
GB    2550900 A     12/2017
(Continued)

OTHER PUBLICATIONS

International Search Report and Written Opinion; PCT/US2021/049361; Korean Intellectual Property Office; dated Dec. 7, 2021; 9 pages.

*Primary Examiner* — Dixomara Vargas
(74) *Attorney, Agent, or Firm* — Cantor Colburn LLP

(57) ABSTRACT

An apparatus for performing a nuclear magnetic resonance (NMR) measurement in a borehole penetrating a subsurface formation includes an NMR tool having an outside diameter that is less than an inside diameter of a drill tubular disposed in the borehole, the drill tubular having an opening at the distal end of the drill tubular leading into the borehole, and a retaining device configured to allow at least a section of the NMR tool to protrude through the opening of the drill tubular and prevent an unrestrained release of the NMR tool through the opening. The apparatus also includes a transmitter antenna and a receiver antenna coupled to the NMR tool, wherein the transmitter antenna and/or the receiver antenna are extendable from the NMR tool.

20 Claims, 15 Drawing Sheets

(51) Int. Cl.
*G01R 33/34* (2006.01)
*G01R 33/36* (2006.01)
*G01R 33/383* (2006.01)

(56) References Cited

U.S. PATENT DOCUMENTS

| | | | |
|---|---|---|---|
| 9,069,098 B2* | 6/2015 | Hopper | G01V 3/32 |
| 9,194,972 B2 | 11/2015 | Van Der Zwaah et al. | |
| 9,903,199 B2* | 2/2018 | Clarke | H01Q 19/062 |
| 10,174,569 B2 | 1/2019 | Rapoport | |
| 10,465,509 B2* | 11/2019 | Yao | E21B 47/085 |
| 10,527,748 B2 | 1/2020 | Li et al. | |
| 11,119,239 B2* | 9/2021 | Kouchmeshky | G01V 3/38 |
| 2004/0251027 A1* | 12/2004 | Sonnier | E21B 47/00 |
| | | | 166/55.1 |
| 2006/0132129 A1* | 6/2006 | Edwards | G01V 3/32 |
| | | | 324/303 |
| 2008/0230273 A1* | 9/2008 | Brooks | E21B 47/024 |
| | | | 175/45 |
| 2010/0326659 A1* | 12/2010 | Schultz | E21B 29/02 |
| | | | 166/297 |
| 2011/0109311 A1* | 5/2011 | Walsh | G01V 3/18 |
| | | | 324/309 |
| 2014/0253119 A1* | 9/2014 | Walsh | G01V 3/38 |
| | | | 324/309 |
| 2014/0298900 A1* | 10/2014 | Clarke | E21B 49/00 |
| | | | 73/152.55 |
| 2016/0108687 A1 | 4/2016 | Rapoport | |
| 2016/0341710 A1 | 11/2016 | Jensen | |
| 2017/0010380 A1 | 1/2017 | Reiderman | |
| 2017/0176361 A1 | 6/2017 | Shao et al. | |
| 2017/0343697 A1* | 11/2017 | Ramirez | G01N 24/081 |
| 2018/0003654 A1 | 1/2018 | Chen et al. | |
| 2018/0100950 A1* | 4/2018 | Yao | E21B 49/003 |
| 2018/0188194 A1 | 7/2018 | Rapoport et al. | |
| 2018/0203151 A1* | 7/2018 | Kouchmeshky | G01V 3/38 |
| 2018/0231682 A1* | 8/2018 | Ramirez | G01V 3/32 |

FOREIGN PATENT DOCUMENTS

| | | |
|---|---|---|
| GB | 2552275 A | 1/2018 |
| WO | 2014207695 A1 | 12/2014 |
| WO | 2018160253 A1 | 9/2018 |
| WO | 2019125472 A2 | 6/2019 |

* cited by examiner

THROUGH-BIT RECONFIGURABLE NMR LOGGING TOOL

BACKGROUND

Nuclear magnetic resonance (NMR) logging provides valuable information for characterizing subsurface geologic formations. One type of NMR tool is a measurement-while-drilling (MWD) tool. The NMR-MWD tool is coupled to a drill string and performs NMR measurements as the drill string rotates to drill a borehole into a formation. Unfortunately, MWD NMR operations can be expensive. Hence, novel NMR operations using new NMR tools that would be less expensive would be well received in industries that make use of geologic formations.

BRIEF SUMMARY

Disclosed is an apparatus for performing a nuclear magnetic resonance (NMR) measurement in a borehole penetrating a subsurface formation. The apparatus includes: an NMR tool having an outside diameter that is less than an inside diameter of a drill tubular disposed in the borehole, the drill tubular having an opening at the distal end of the drill tubular leading into the borehole; a retaining device configured to allow at least a section of the NMR tool to protrude through the opening of the drill tubular and prevent an unrestrained release of the NMR tool through the opening; a magnet coupled to the NMR tool; a transmitter antenna coupled to the NMR tool and configured to transmit electromagnetic (EM) energy into the subsurface formation; and a receiver antenna coupled to the NMR tool and configured to receive an NMR signal in response to transmitted EM energy to perform the NMR measurement; wherein the transmitter antenna and/or the receiver antenna are extendable from the NMR tool.

Also disclosed is a method for performing a nuclear magnetic resonance (NMR) measurement in a borehole penetrating a subsurface formation. The method includes: conveying an NMR tool inside a drill tubular to a distal end of the drill tubular, the drill tubular at the distal end having an opening that leads into the borehole; allowing at least a sensing section of the NMR tool to protrude through the opening into the borehole; preventing the NMR tool from escaping through the opening using a retaining device; removing the drill tubular from the borehole with at least the sensing section of the NMR tool protruding from the opening into the borehole; and performing NMR measurements of the subsurface formation along the borehole with removal of the drill tubular.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method presented herein by way of exemplification and not limitation with reference to the figures.

Disclosed are apparatuses and methods for performing nuclear magnetic resonance (NMR) measurements of a subsurface geologic formation with novel NMR apparatus disposed in a borehole penetrating the formation. An NMR tool, which may be connected to a wireline, is disposed in and conveyed through a drill tubular such as a drill string. The NMR tool is conveyed to or near a distal or downhole end of the drill tubular to an opening that leads to the open borehole. The opening may be in a drill bit coupled to the drill tubular. At least a sensing section or portion of the NMR tool exits the drill tubular through the opening. A retaining device prevents uncontrolled or unrestrained release of the NMR tool into the borehole. Once the sensing section of the NMR tool exits the drill tubular, a single NMR receiver antenna or an array of NMR receiver antennas extends from the NMR tool and makes contact with the borehole wall. Other components may also extend from the NMR tool such as a single NMR transmitter antenna or an array of NMR transmitter antennas. With the NMR tool in a configuration to perform NMR measurements, the drill tubular along with the NMR tool is withdrawn from the borehole and NMR measurements are performed to provide an NMR measurement log.

Figure 1:
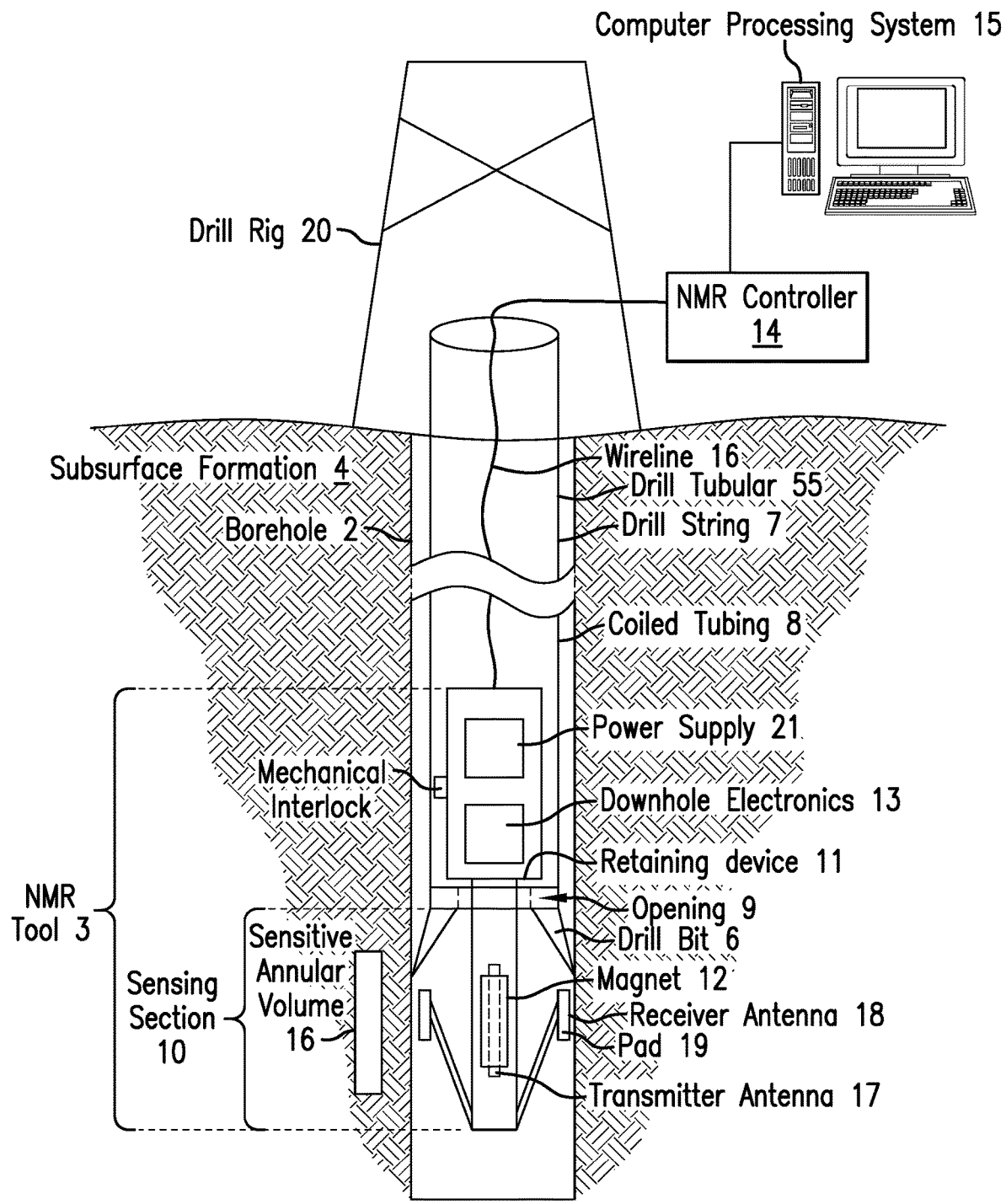
FIG. 1 is a cross-sectional view of an embodiment of an NMR tool protruding through an opening in a drill bit coupled to a drill tubular.

FIG. 1 illustrates a cross-sectional view of a borehole 2 (also referred to as a well) penetrating a subsurface formation 4. In hydrocarbon production embodiments, the formation 4 contains a reservoir of hydrocarbons. A drill tubular 5 is disposed in the borehole 2 and is coupled to a drill bit 6 that is configured to drill the borehole 2. In one or more embodiments, the drill tubular 5 is a drill string 7 having a series of coupled drill pipes. The drill string 7 is configured to rotate and thus rotate the drill bit 6 to drill the borehole 2. In one or more embodiments, the drill tubular 5 is coiled tubing 8. In general, a mud-motor (not shown) is attached to the coiled tubing 8 and converts energy of flowing drilling fluid to rotational movement of the drill bit 6 to drill the borehole 2. The lower end of the drill tubular 5 including the drill bit 6 may be referred to as a bottomhole assembly (BHA). A drill rig 20 is configured to conduct drilling operations by controlling operation and movement of the drill tubular 5.

Figure 5:
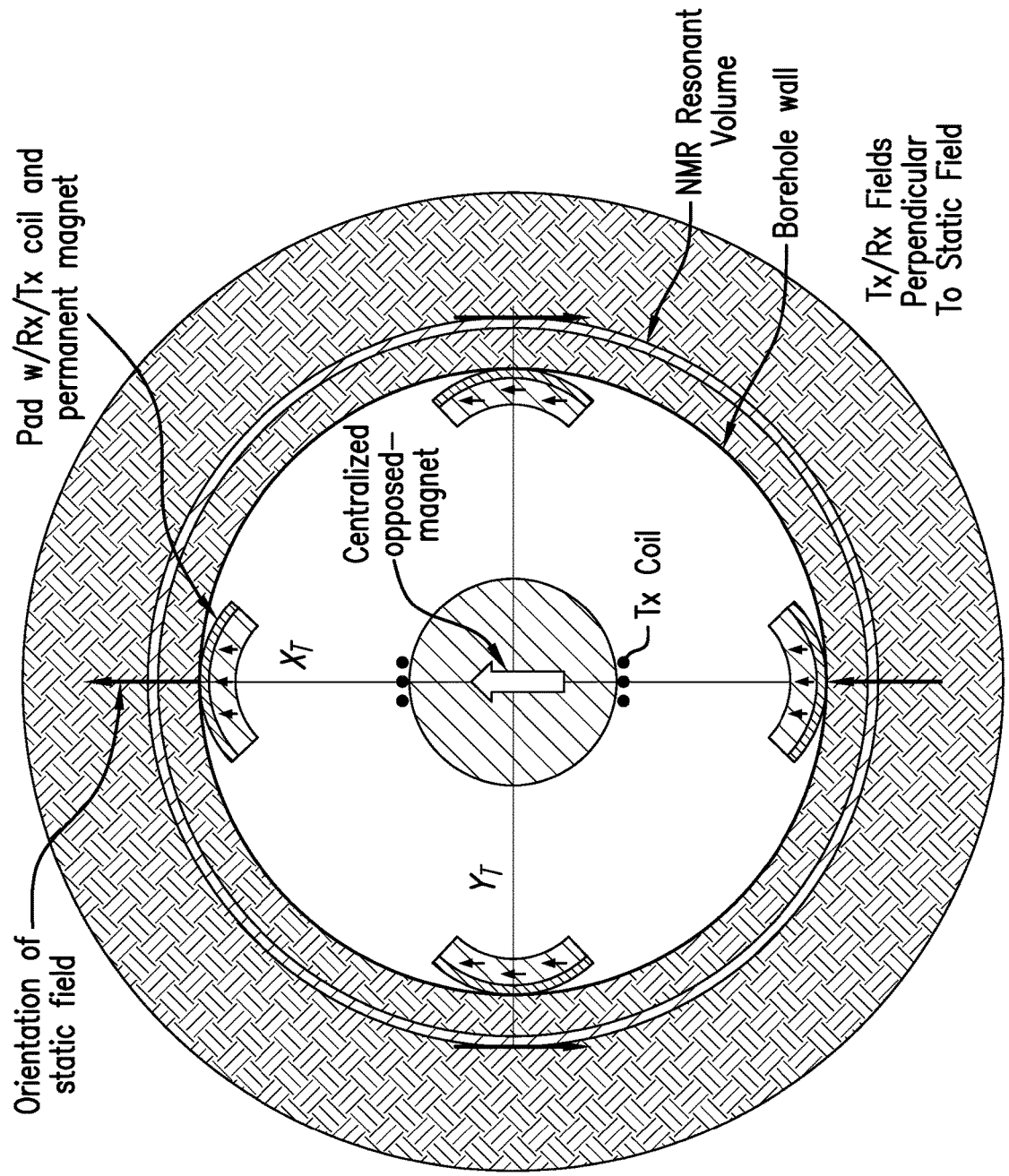
FIG. 5 depicts aspects of the first embodiment of the NMR tool with a reconfigurable magnet.

An NMR tool 3 has an outer diameter or outer dimension that is less than the inner diameter of the drill tubular 5 so that the NMR tool 3 can be inserted into the drill tubular 5, generally at the geologic surface, and conveyed to the downhole end of the drill tubular 5. In the embodiment of FIG. 5, the drill bit 6, which may be considered part of the drill tubular 5, defines an opening 9 that has a diameter or dimension that is greater than the outer diameter or outer dimension of the NMR tool 3 or a sensing section 10 of the NMR tool 3. Hence, the NMR tool 3 or the sensing section 10 of the NMR tool 3 can protrude out of the opening 9 into the open borehole 3. The sensing section 10 of the NMR tool 3 includes those NMR components needed to be exposed in the open borehole 3 for performing NMR measurements.

The NMR tool 3 is restrained from leaving control by or contact with the drill bit 6 and thus the drill tubular 5 by a retaining device 11. Thus, as the drill tubular 5 is removed from the borehole 2, the NMR tool 3 follows and moves uphole (i.e., towards the surface). As the NMR tool 3 moves uphole with the drill tubular 5, the NMR tool 3 performs NMR measurements of the formation 4 at various recorded depths to generate an NMR log. In one or more embodiments, the retaining device 11 is integral to the NMR tool 3. For example, while the sensing section 10 has an outer diameter or dimension that is less than the corresponding inner diameter or dimension of the opening 9, a remaining section of the NMR tool 3 on the uphole side of the NMR tool 3 can have an outer diameter or dimension that is greater than the corresponding inner diameter or dimension of the opening 9, thus preventing the whole NMR tool 3 from escaping through the opening 9. With this configuration, the NMR tool 3 will remain in contact with the drill tubular 5 as the drill tubular 5 is removed from the borehole 2. Alternatively, the retaining device 11 can be a mechanical mechanism such as a spring-loaded lever that engages a recess in the drill tubular 5, the drill bit 6, or the BHA when the retaining device 11 reaches the recess. Other types of mechanical mechanisms may also be used.

The NMR tool 3 includes downhole electronics 13 configured to operate the NMR tool 3, process acquired NMR data, and/or record and store the NMR data for later retrieval after the NMR tool 3 is removed from the borehole. In the embodiment of FIG. 1, the NMR tool 3 is coupled to a wireline 16 for (a) controlling the conveyance of the NMR tool 3 through the drill tubular 5 and (b) temporarily providing a communication medium between an NMR controller 14 at the surface and the NMR tool 3 disposed downhole. The NMR controller 14 is configured to communicate with the NMR tool 3 to check the health or operational status of the NMR tool 3 before the NMR tool 3 is moved uphole and performs NMR measurements. If the health or operational status of the NMR tool 3 is satisfactory, then the wireline 16 can be disconnected and the removal of the drill tubular 5 along with NMR logging can begin. The wireline 16 may include a wire disconnect device configured to disconnect based on pulling force. The NMR controller 14 may be coupled to a surface computer processing system 15. The NMR controller 14 or the computer processing system 15 may be configured to download the acquired NMR data stored in a memory of the NMR tool 3 upon retrieval of the NMR tool 3, process the NMR data, and/or present the NMR data to a user. Various data processing functions may be performed the downhole electronics 13, the NMR controller 14, and/or the surface computer processing system 15 either individually, in combination, or in overlap to provide redundant capability. Power for the NMR tool 3 may be supplied by a power supply 21 such as a battery or mud-motor.

The NMR tool 3 includes a magnet 12 configured to provide a static magnetic field in a sensitive annular volume 16 for performing the NMR measurements. In one or more embodiments, the magnet 12 is a permanent magnet or a plurality of permanent magnets. Various configurations of the permanent magnet 12 are discussed further below.

The NMR tool 3 also includes a transmitter antenna 17 configured to transmit radio-frequency (RF) electromagnetic energy into the sensitive volume 16 (also referred to as resonant volume) in order to tilt and re-focus nuclear spins of the atoms in a selected direction in the sensitive volume 16 such as by using a CPMG sequence as known in the art in a non-limiting embodiment. In one or more embodiments, the transmitter antenna 17 includes a coil or a plurality of coils where each coil includes a loop of one or more turns of a conductor. In one or more embodiments, the transmitter antenna 17 is an extendable transmitter antenna or an extendable array of transmitter antennas. Various configurations of the transmitter antenna 17 are discussed further below.

The NMR tool 3 further includes an extendable receiver antenna 18 configured to receive NMR signals from the sensitive volume 16. The term "extendable" as used herein relates to a component, such as the magnet, the transmitter antenna and the receiver antenna, being in a compact or closed form for conveyance through the drill tubular 5 and then having the ability of extend outward after that component protrudes through the opening 9. The received NMR signals, which may also be referred to as echoes, are varying magnetic fields due to the precessing of the nuclear spins in the static magnetic field after the nuclear spins are tilted and refocused. In one or more embodiments, the receiver antenna 18 includes a coil or a plurality of coils where each coil includes a loop of one or more turns of a conductor. In one or more embodiments, the extendable receiver antenna 18 is an extendable array of receiver antennas. Various configurations of the receiver antenna 18 are discussed further below. In one or more embodiments, the receiver antenna 18 is disposed on a pad 19 for support and deployment purposes. Foregoing discussions involving pads inherently include any antennas disposed thereon. In some embodiments, the receiver antenna (e.g., coil) or array of receiver antennas also serves as the transmission antenna or array of transmission antennas, respectively, and vice versa.

In general, the received NMR signals or echoes are used to determine a longitudinal relaxation time-constant referred to as $T_1$ and/or a transverse relaxation time-constant referred to as $T_2$. Distributions of $T_1$ and $T_2$ and corresponding two-dimensional maps may be obtained from these measurements. From these time constants, various properties of the formation 4 may be determined such as porosity. In that the processing of NMR data and the use of the NMR data to determine various properties of the formation 4 are well known in the art, the processing and use of NMR data are not discussed in further detail.

As noted above, the drill tubular 5 may be the coiled tubing 8. In this case, the NMR logging tool 3 may be conveyed into the well 2 through the coiled tubing 8 used to drill the well 2. After drilling is completed, the drill bit 6 is withdrawn from slightly from the well 2 so there is sufficient room below the bit 6 for the NMR logging tool 3. The tool 3 is inserted into the coiled tubing 8. In one or more embodiments, it is connected to the wireline 16. It is conveyed to the bottom of the well 2 by pumping drilling fluid into the coiled tubing 8. When it reaches the drill bit 6, the sensor portion of the tool is conveyed through the drill bit 6. The conveyance of the tool 3 is stopped by a section of the logging tool 3 that mates with to a go/no-go fitting or similar device (e.g., the retaining device) on the drill bit 6 or on the bottom-hole assembly (BHA). Pumping of the drilling mud is stopped at this point and the NMR logging tool 3 is reconfigured for logging and tested for its operational status. If the tool 3 is operational, the wireline is disconnected, withdrawn and the tool 3 begins to collect data using onboard batteries. Alternatively, a mud-motor powered by pumped drilling fluid may be used to provide power. The coiled tubing 8 is gradually withdrawn in order to log the formation 4. The advantage of this method of operation is that the coiled tubing 8 remains in the well 2 and rig time is reduced with the associated cost savings.

It can be appreciated that if wired drill pipe is being used as the drill tubular, the NMR tool 3 can be in constant communication with the NMR controller at the surface while the drill string is being withdrawn. In this case, near-field communication (NFC) components can be used to set up a communications link with the wired drill pipe.

A first embodiment of the NMR tool having a transverse-dipole and a centralized transmitter (TX) coil is now discussed with reference to FIG. 2.

Figure 2:
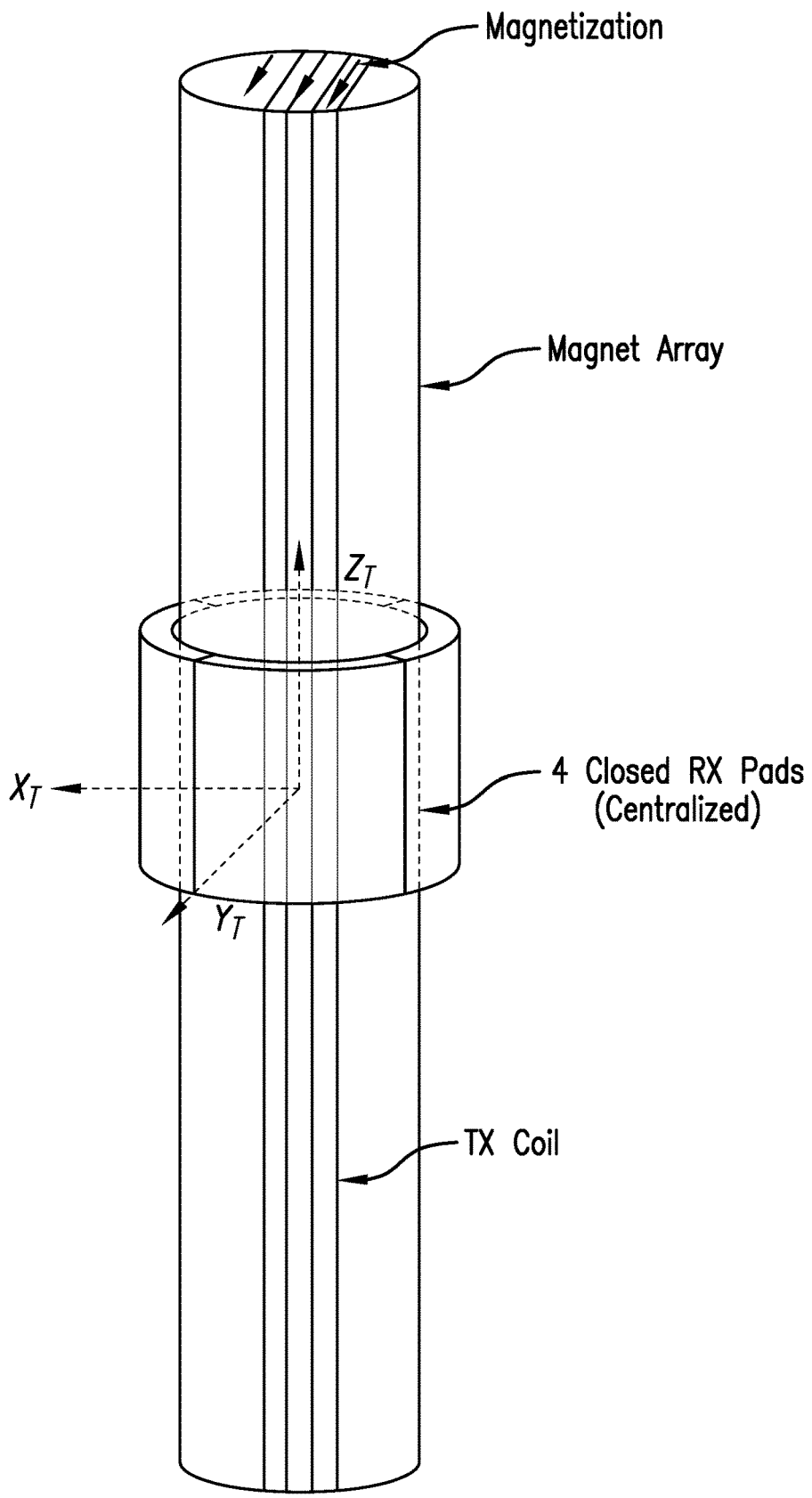
FIG. 2 depicts aspects of an NMR magnet structure with four closed pads having receiver coils in an interstitial space.

FIG. 2 illustrates an NMR permanent magnet structure with four closed pads, located in an interstitial space in the structure that contain receiver coils. A transmit coil is wound around the permanent magnet array. The arrows at the top of the magnet array illustrate the direction of the permanent magnet array magnetization. The tool body and mechanical parts of the NMR tool are not shown. In this embodiment, a centralized permanent magnet or magnets establish the static field for the measurement. The static field is substantially a two-dimension dipole field with its orientation perpendicular (transverse) to the longitudinal axis of the NMR tool.

The RF transmission coil is centralized and is wound such that it substantially creates a two-dimensional transverse dipole field. In addition to being perpendicular to the NMR tool's longitudinal axis, the field is also substantially perpendicular to the static magnetic field. The configuration of the transmit coil and permanent magnet or magnets creates the conditions for NMR excitation in a cylindrical shell (i.e., sensitive or resonance volume) about the longitudinal axis of the logging instrument. The permanent magnet can be much longer in the $Z_T$ direction than the extent of the TX coil. This may be referred to as a crossed-dipole configuration. A cross-section of the configuration is illustrated in FIG. 5. It can be appreciated that better performance may be achieved with a transmission coil that extends from the tool to be closer to the borehole wall.

The receiver coils are located on or inside pads. The pads are in the contracted position while the NMR tool is being deployed. Once the NMR tool is below the drill bit, the pads are moved and reconfigured to be in contact with the borehole wall. Because the static magnetic field is a function of the azimuthal angle, the configuration of the receiver coils must also be a function of the azimuthal angle. For example, when the static magnetic field is perpendicular to the radius of the cylindrical shell, the receiver coil can be a simple dipole loop coil or a spiral wound coil. When the static magnetic field is parallel to the radius of cylindrical shell, the receiver coil must have quadrupolar configuration such as butterfly coil. Alternatively, all the receiver coils could have a quadrupolar configuration parallel to the longitudinal axis of the instrument. Other coil configurations and/or coil types may also be used.

In the first embodiment, there are two or more pads to improve the signal-to-noise ratio (SNR) of the NMR measurement as well as create an NMR image log. When the instrument is in the closed position for conveyance, the pads are located in pockets in a body of the NMR tool such that the ring diameter of the tool is less that the diameter of the drill tubular through which it is being conveyed. When the NMR tool is below the drill bit, the pads are deployed to their open position such that they are in contact with the borehole wall and in a region of the tool configuration in which NMR measurements can be made. Contact with the borehole wall maximizes the sensitivity of the NMR measurement.

The location of the pads, which are inclusive of antennas, in the closed position can be above or below the NMR tool's permanent magnet array. They can also be located in pockets in an interstitial space of the permanent magnet array as illustrated in FIG. 2. The magnet array is a simple cylindrical magnet (center cylinder in FIG. 2) with its magnetization perpendicular to its cylindrical axis. The pads are shown in the closed position. The transmitter coil is wound around the magnet array such that its magnetic field is perpendicular to both the magnet's cylindrical axis and the magnet's magnetization. The permanent magnet array can also be composed of three cylinders. Two of the cylinders, one below the pads and one above, could have a diameter larger than the inner diameter of the pads in the closed position. The third magnet can be located inside the closed pads.

Figure 3:
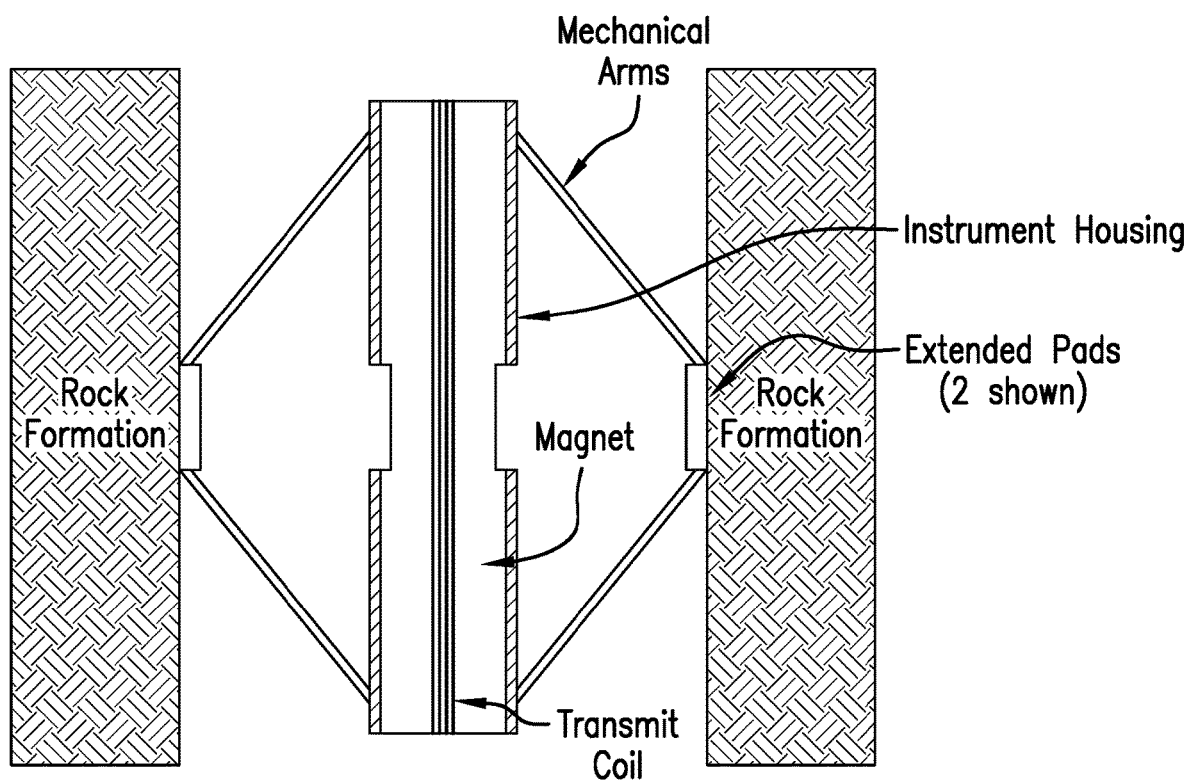
FIG. 3 depicts aspects of an embodiment of the NMR tool with the pads extended.

FIG. 3 illustrates a cross-sectional view of embodiment 1 with the pads having receiver coils extended. Only two of the four pads are shown. The pads retract to a recess interstitial to the permanent magnet array. Mechanical arms are actuated to extend the pads to be in contact with the rock formation and retract them into the recess. In this illustration, the magnet is composed of three cylinders in the configuration described earlier. An electrically powered actuator (not shown) may be coupled to the mechanical arms to extend and retract them. Other types of actuators and other types of arm configurations may also be used such as arms that extend from above or below the magnet.

Figure 4:
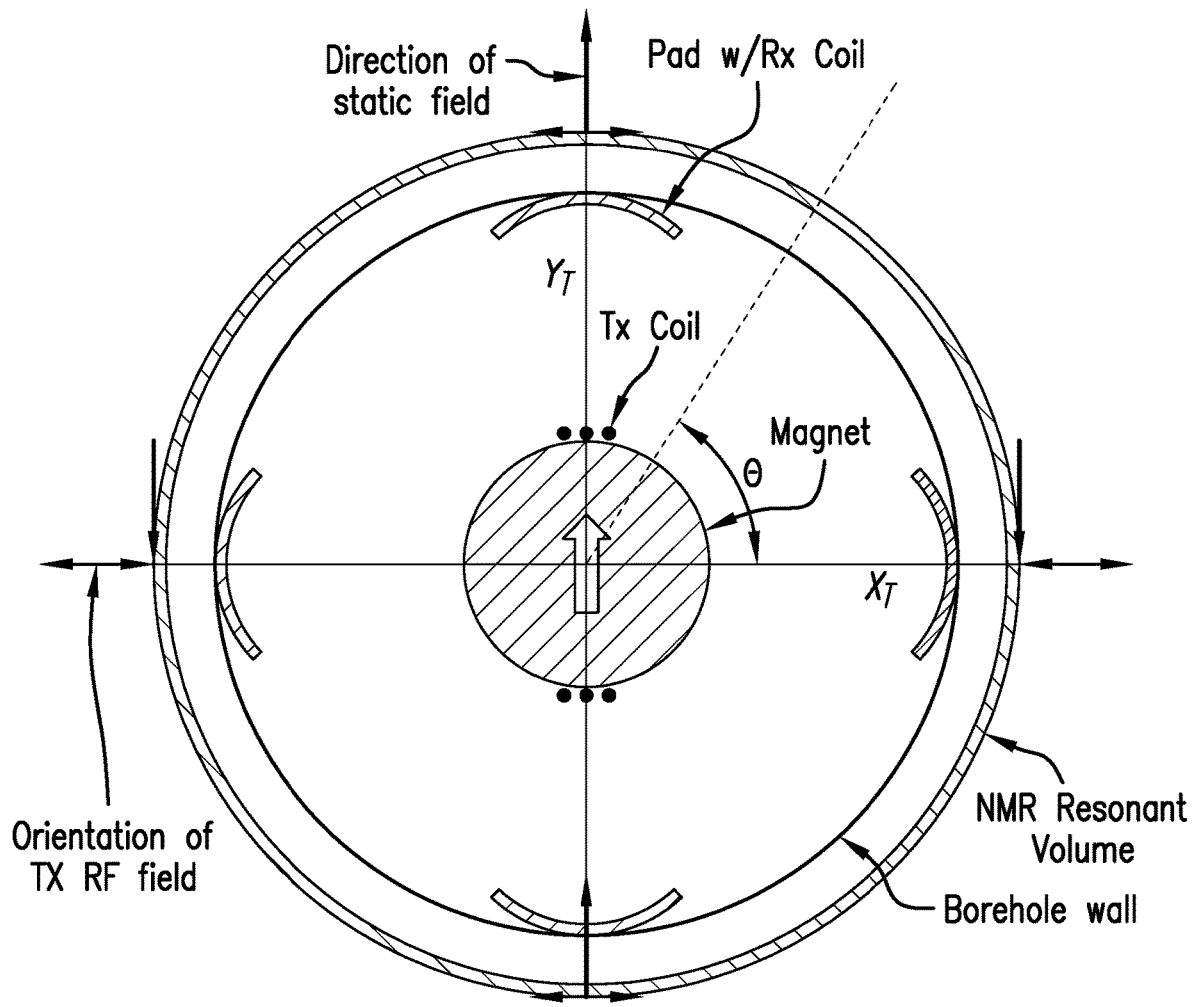
FIG. 4 depicts aspects of a first embodiment of the NMR tool the pads having receiver coils extended.

FIGS. 4 and 5 illustrate top views of the first embodiment with the four pads extended. The permanent magnet is in the center and the vertical arrow depicts the magnetization vector. The transmit coil is shown as three conductors wrapped around the permanent magnet. The pads with receiver coils are shown pressed against the borehole wall. In the cross-dipole configuration, the excited or sensitive volume is a cylindrical or approximately cylindrical annulus shown outside of the borehole wall. The orientation of the static field is perpendicular to the transmitted RF field at all locations in the cylindrical symmetry proximal to receive antennas. Note that the left and right side coils can be loop coils that produce a RF filed that is primarily in the left-right direction, but the top and bottom shown coils must be something like a butterfly coil that has a primary RF field direction either in the left-right direction or in the direction into and out of the plane of the page. The directions of the magnetic fields are given by the vectors $d_S$ for the static magnetic field and $d_{TX}$ for the transmitted RF field.

$$d_S = \hat{x} \sin 2\theta + \vec{\hat{y}} \cos 2\theta;$$

$$d_{TX} = \hat{x} \cos 2\theta + \hat{y} \sin 2\theta \quad (1)$$

This creates the condition for nuclear magnetic resonance throughout the sensitive volume. The receiver coils must be sensitive to the NMR signal excited by the transmitted RF energy. Thus, the magnetic field produced by a unit current in the receiver coils should be orthogonal to the static magnetic field for maximum sensitivity. If the magnetic field is not perpendicular, the sensitivity is reduced, since it is proportional only to the component of the magnetic field that is perpendicular. If the magnitude of the unit current magnetic field produced by the receiver coils is $B_{RX}$ and its direction is $d_{RX}$, then the condition for maximum sensitivity is $$d_{RX} \cdot d_S = 0 \qquad (2)$$

Two conditions that satisfy this constraint are $$d_{RX} = \hat{z}_T;$$

$$d_{RX} = d_{TX} \qquad (3)$$

Here, $Z_T$ is the z-axis which is along the cylindrical axis of the magnet/tool and all the axes are defined in FIG. 2.

FIG. 5 illustrates an embodiment of the NMR tool with a reconfigurable magnet. In this embodiment, the permanent magnet includes an array of permanent magnets where each magnet in the array extends to be closer to or make contact with the borehole wall.

As discussed above, two types of receiver coils can be used to implement the first embodiment. These are a "butterfly" or "figure-eight" coil and a standard loop coil. The standard loop coil with NL turns produces a dipolar magnetic field. The principal direction of the magnetic field is parallel to the symmetry axis of the coil. It detects RF magnetic fields that are perpendicular to the plane of the coil because its unit magnetic field is in that direction. The "butterfly" coil includes two loops with the electrical current in the different loops either moving in a clockwise or counter-clockwise direction. The magnetic field is substantially parallel to the plane of the coil. The field it produces is quadrupolar in character. The intensity of its magnetic field decreases as the fifth power of the inverse distance from the plane of the coil as compared to the loop coil with decreases according to the inverse third power, yet the butterfly coil generally has a higher sensitivity at distances very close to the coil surface. Thus, the need for extendable or expandable coils is established requiring butterfly or figure-8 coils to be pushed out as close to the borehole wall or formation as possible.

Figure 6:
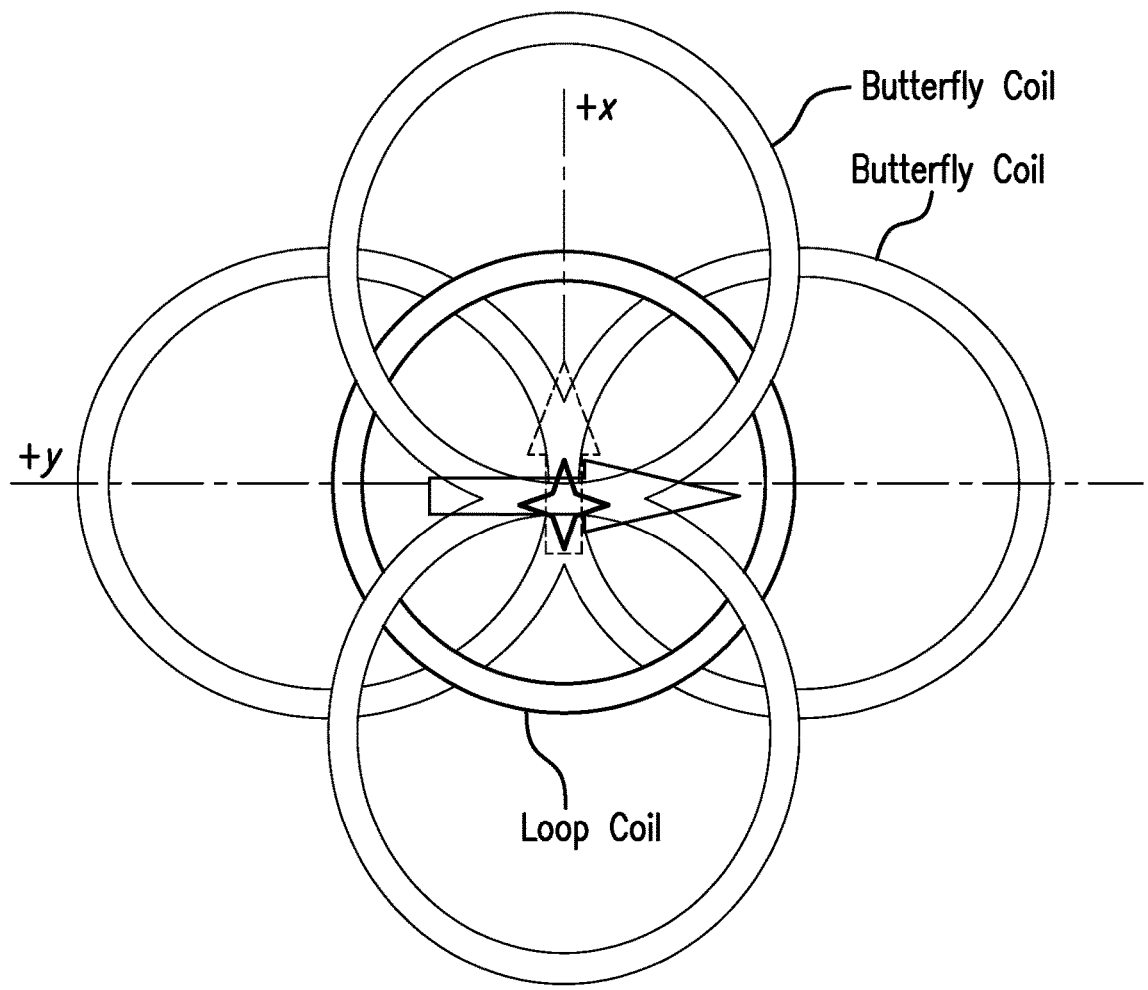
FIG. 6 depicts aspects of an extendable pad having a loop coil and two butterfly coils.

In the embodiments of FIGS. 4 and 5, the z-axis of the coils is perpendicular to the radius of the borehole (see FIG. 6). FIG. 6 illustrates a coil configuration for a pad with three coils. Two of the coils are butterfly coils and one coil is a simple loop. The z-axis of the coils is parallel to a radial direction of the borehole. The x-axis and the y-axis are perpendicular to the radial direction. Thus, the loop coil is sensitive at the pad locations along the horizontal axis of the figure and insensitive at the pad locations along the vertical axis of the figure. The butterfly coil can have two sensitive orientations in the pads. The first is with its y-axis (see FIG. 6) perpendicular to the cylindrical axis of the tool or magnet array (shown as butterfly coil in horizontal orientation) and the second is with its y-axis parallel to the cylindrical axis (shown as butterfly coil in vertical orientation). In the first instance, the butterfly coil is sensitive along YT and insensitive along XT of the tool. Thus, in the embodiment as illustrated in FIG. 6, the coils in the pads along XT will be loop coils and the coils in the pads along YT will be butterfly coils. Note that the arrows and star illustrate the direction of magnetic flux density in FIG. 6.

If there are more than four pads or that at least one pad is not aligned along either the XT or YT axes. Then neither coil will have optimized sensitivity. However, if the pads contain both types of coils, then the sensitivity can be maximized by detecting with both and combining the signals with the proper phase that depends on the orientation of the pads with respect to the tool XT and YT axes. (shown as center loop and butterfly coil in horizontal orientation). If the symmetry axes of the two types of coils are aligned, then the coils are completely decoupled (i.e., the mutual inductance between the coils will be minimized and the measurements will be independent, where they can be combined to produce optimal signal-to-noise ratios or SNRs).

The second possible orientation of the butterfly coil is with its y-axis parallel the ZT. The butterfly coil is now insensitive to the orientation of the pad because its magnetic field is always perpendicular to the static field. Thus, every pad, regardless of orientation can use this configuration.

Another possibility is combining three coils on the same pad as shown in FIG. 6. If the z-axes of each coil are aligned, the coils are completely decoupled. In this configuration, the signal from the coils can be combined when properly phased to perform quadrature detection. This improves the sensitivity and/or SNR of the measurement.

A second embodiment of the NMR tool having a transverse dipole magnet with pad mounted TX is now discussed.

This embodiment is related to the first embodiment. It keeps the orientation of the permanent magnet shown in FIGS. 2 and 4 with the exception of removing the centralized transverse dipole TX coil and replacing it with a plurality of pad mounted TX coils. At least one TX coil is mounted on each pad. For example, the pad can contain the three types of coils as illustrated in FIG. 6. The central loop coil and horizontal butterfly coil remain as RX coils but the butterfly coil oriented with its y-axis in the vertical direction is used as the TX coil. In another coil configuration, the vertical butterfly coil is used as a TX and RX coil. In fact, any one or all of the RX coils shown in FIG. 6 can be used as both TX and RX coils.

In another configuration, a separate TX coil is used in combination with one to three RX coils. Here the TX coil is a vertically oriented butterfly coil so that it can be used in any pad orientation. It is important to note that similarly oriented butterfly coils are highly coupled. The coupling, however, can be reduced or eliminated without significantly affecting the magnetic field produced by the coils in the formation by changing the geometry of the coils slightly.

In still another configuration, there are three TX coils and one or more RX coils. In this configuration, the currents that transmitter electronics apply to the TX coils is phased in such a way that the transmitted RF field is rotating about the static field direction. In such a configuration, the phases in the TX coils will depend on the orientation of the pad. Using three TX coils in this manner will optimize the RF transmitted power.

A third embodiment of the NMR tool having a transverse dipole magnet with pad mounted TX is now discussed.

In this embodiment, each pad has a receive (RX) coil and a permanent magnet array. The magnetization of the permanent magnet array is in a direction that reinforces or adds to the magnetic field generated by the centralized magnet array. The pads may be deployed from above or below the centralized magnet array using mechanical arms and actuators. A cross section of this embodiment is shown in FIG. 5. A central arrow illustrates a direction of magnetization of the static magnetic field. Only four pads are shown but this is not a limitation. There could be more or fewer. The transmit coil is shown wrapped about the centralized magnet. However, this is not a limitation. The coil arrangements in previously described embodiments are also applicable in this embodiment.

A fourth embodiment of the NMR tool in a configuration having a transverse dipole magnet with expandable RX/TX coils is now discussed.

In this embodiment, when the pads are deployed, either they are connected with members that are jointed or sliding that deploy an RF transceiver coil (i.e., coil for transmitting and receiving). The transceiver coil can be of several types such as a transverse dipole antenna, a "bird-cage" coil, or a vertical solenoid coil in non-limiting embodiments. Similarly, the birdcage coil can be made of several non-connected overlapping individual loop coils, thus offering independent measurements that may be combined to improve SNR or provide spatial information. To reduce coupling, the loop coils may be expanded or extended such that adjacent coils or next-to-adjacent coils may be overlapping, thus minimizing mutual inductance and coupling of magnetic fields and extend field of sensitivity.

Figure 7:
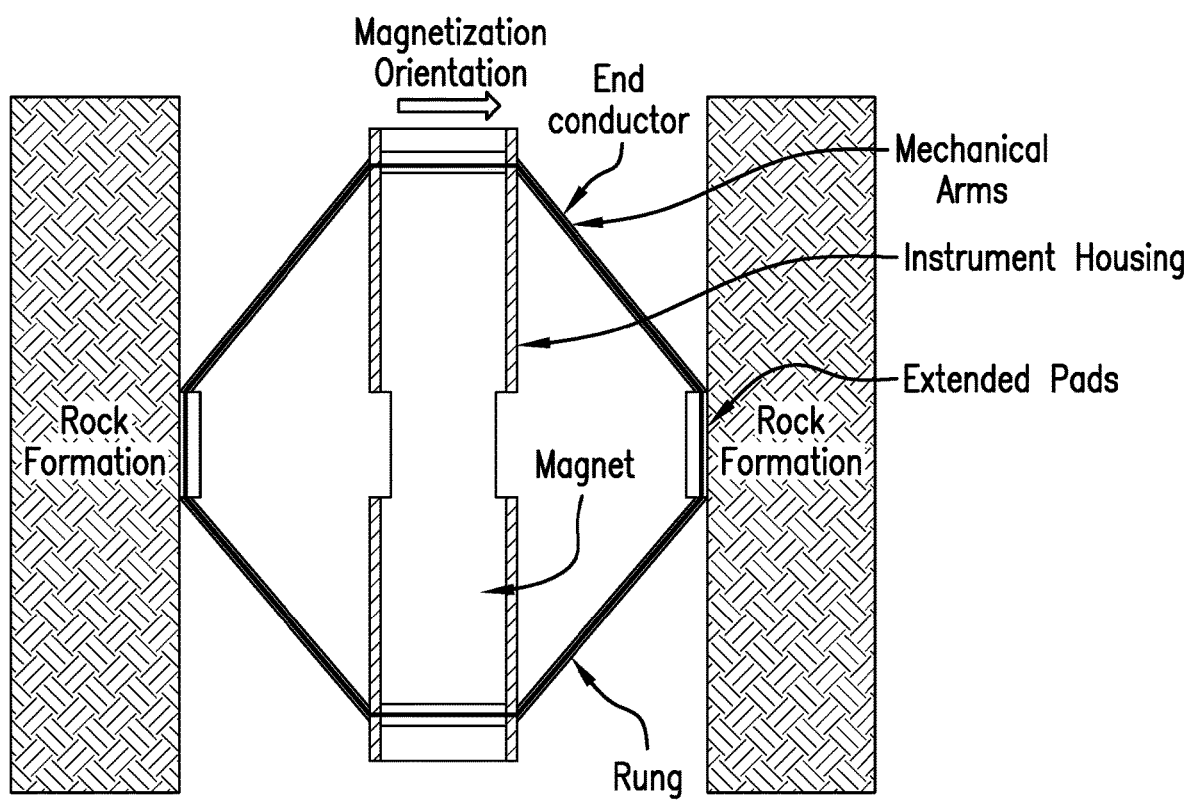
FIG. 7 depicts aspects of the NMR tool having a transverse dipole magnet with an extendable, orthogonal, and traverse receiver coil in a deployed position.

A cross-sectional view of the NMR tool with a transverse dipole magnet and with an expandable, orthogonal, and transverse transceiver coil in the deployed position is shown in FIG. 7. The transceiver coil is parallel to the mechanical arms and pads and is made up of one or more turns of a conductor. Because of the cross-dipole configuration of the transceiver coil and the permanent magnet, the sensitive volume will be an annulus in the rock formation. Its extent can be estimated by numerical modelling. Furthermore, this embodiment does not need sliding or jointed members because standard strain relief methods can be successfully used at the joints. Additionally, it requires only two pads to be deployed. If more pads were used, it could be combined with pads described for the first embodiment. One restriction is that the pads require two mechanical arms each, one below and one above each pad. These are required because they complete the current loops of the transceiver coil.

Birdcage coils are used in low-frequency magnetic resonance imaging applications. It is designed to create a uniform transverse magnetic field within the coil. This interior RF field is a transverse dipole field and therefore, the field outside the coil will also be transverse dipole as well. Thus, the birdcage coil can be used to excite and detect NMR signals in the sensitive volume of the cross-dipole configuration.

Figure 8:
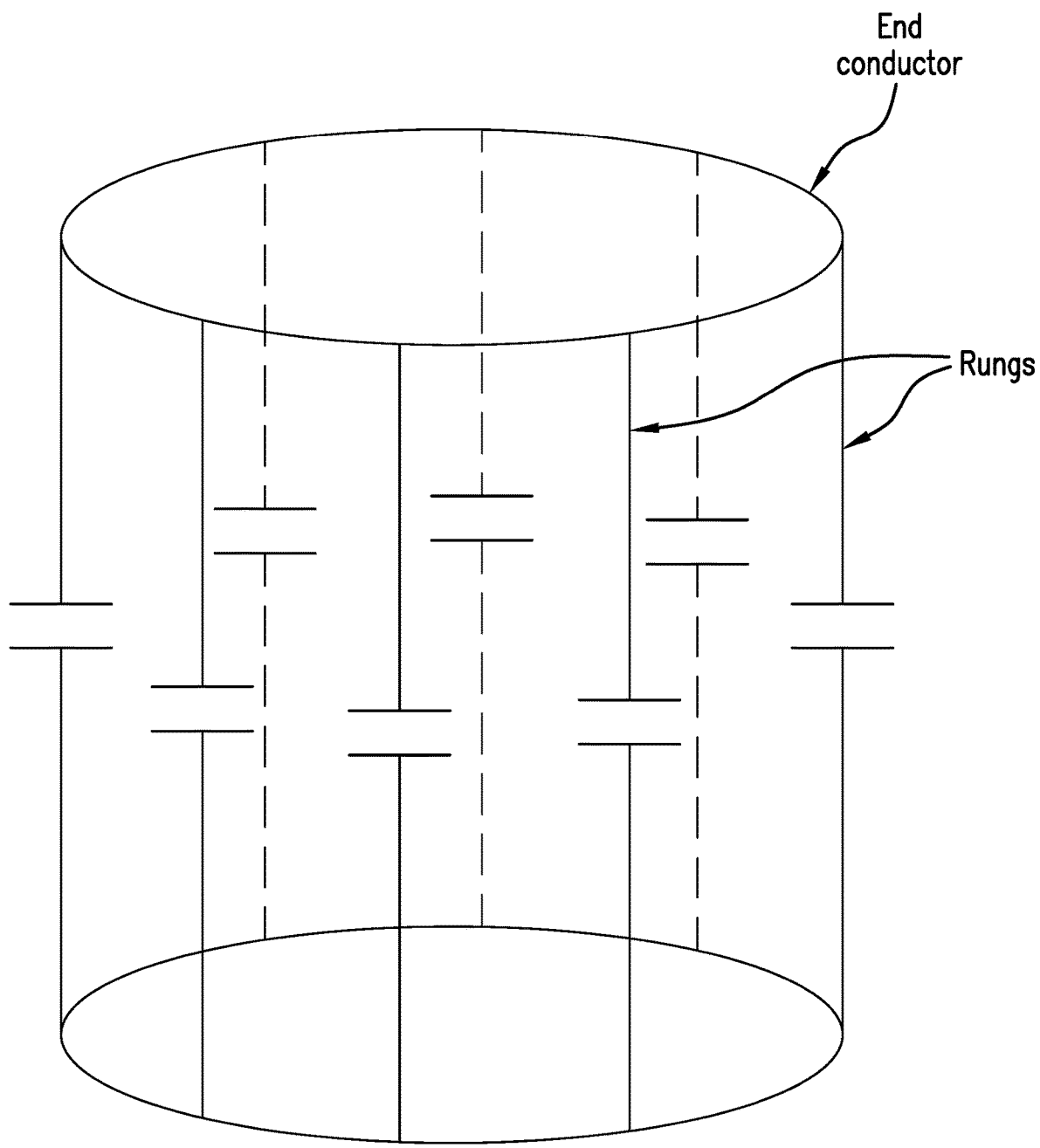
FIG. 8 depicts aspects of a "bird-cage" coil antenna.
Figure 9:
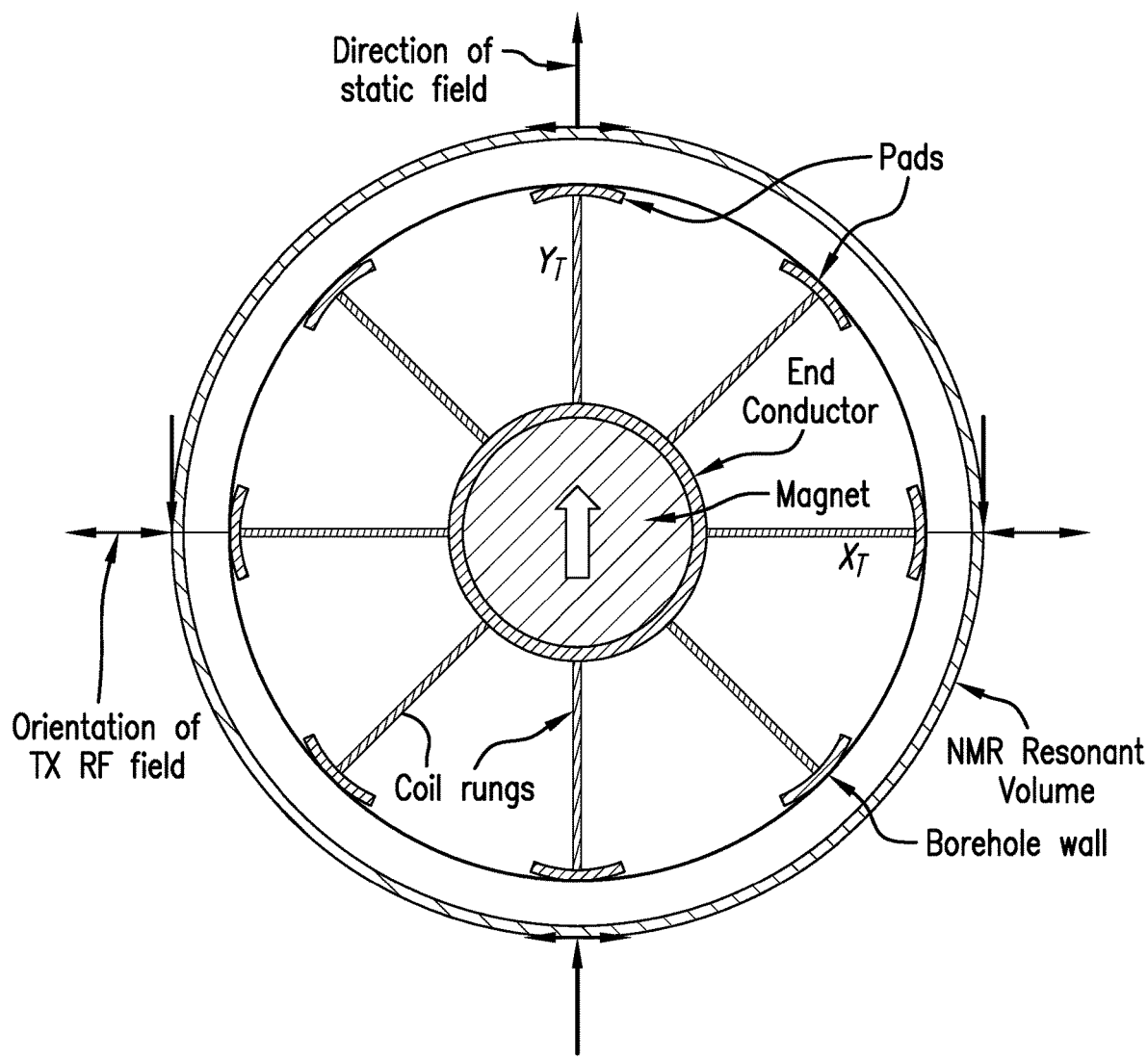
FIG. 9 depicts aspects of an expandable implementation of the bird-cage coil in the NMR tool.

Referring to FIG. 7, the cross-section shown is the cross-section through any of the symmetry planes of the birdcage coil. For the bird-cage coil shown in FIG. 8, there are four symmetry planes, but there could be as few as two or more than four. Strain relief could be used in this configuration to eliminate jointed or sliding conductors. End conductors are part of the tool body as shown. FIG. 9 illustrates a top view of the birdcage coil embodiment in the deployed position. The coil should be driven with a particular phase so that the RF field is perpendicular to static field to optimize the sensitivity. If the phase is not correct, sensitivity will be less and in the extreme case, the sensitivity could be near zero. Each pad may optionally include the low-pass capacitors as shown in FIG. 8.

In this embodiment, an expandable solenoid coil has its symmetry axis substantially parallel to the tool axis, ZT. It is oriented so that its cylindrical axis is oriented along the instrument's Z-axis. In the center plane of the coil, the RF field produced by the coil is parallel to the instrument's Z-axis and therefore perpendicular everywhere for a transverse dipole static magnetic field. In the case where the length or height, $L_C$, is much greater that the diameter, dc, the external magnetic field can be very weak. As the ratio, the external magnetic field also approaches zero. Thus, a solenoid mounted on slim-hole through-bit tool body would not be sensitive or produce a large enough RF field to perform NMR measurements in the formation for large borehole diameters.

However, for a coil with $d_c/L_c>1$, the RF magnetic field produced externally is large enough to conduct NMR measurements. In the limit of very small coil length, the solenoid coil becomes indistinguishable from a multi-turn loop. Thus, an expandable solenoid or loop can be used in an embodiment of the slim-hole, through-bit and reconfigurable NMR tool.

Figure 10:
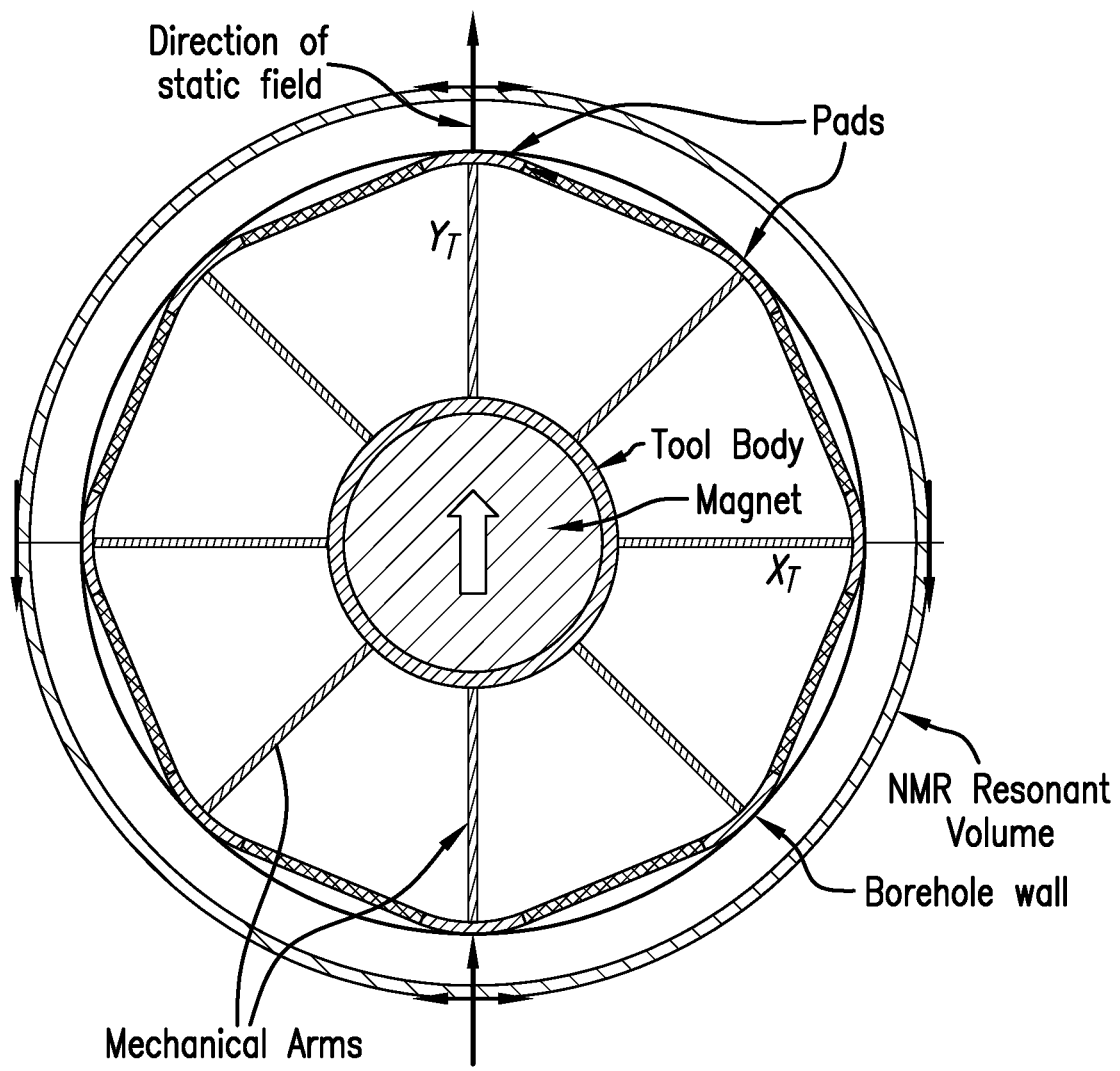
FIG. 10 depicts aspects of an embodiment of the transverse dipole magnet and an expandable solenoid or loop coil its axis aligned with the NMR tool Z-axis.

FIG. 10 illustrates a top view of an embodiment of the transverse dipole magnet and an expandable solenoid or loop coil with its axis aligned with tool Z-axis. The direction of the static magnetic field is shown by arrows in the sensitive volume. An octagon approximates the circular coil/loop. There are eight pads shown but this is not a limitation. There could be more or fewer pads. In one or more embodiments, there are at least three pads.

The segments of the coil that unfold when the coil is deployed are shown forming an octagon. These segments pivot about the center of the pads and have hinged connections at their ends. When the segments are not deployed, they form a "herringbone" pattern within the ring diameter of the tool. The segments can be deployed from any position, above, below, or interstitial to the permanent magnet array because the pads only require a single mechanical arm each. The arms may or may not form part of the current path for the coil.

Figure 11:
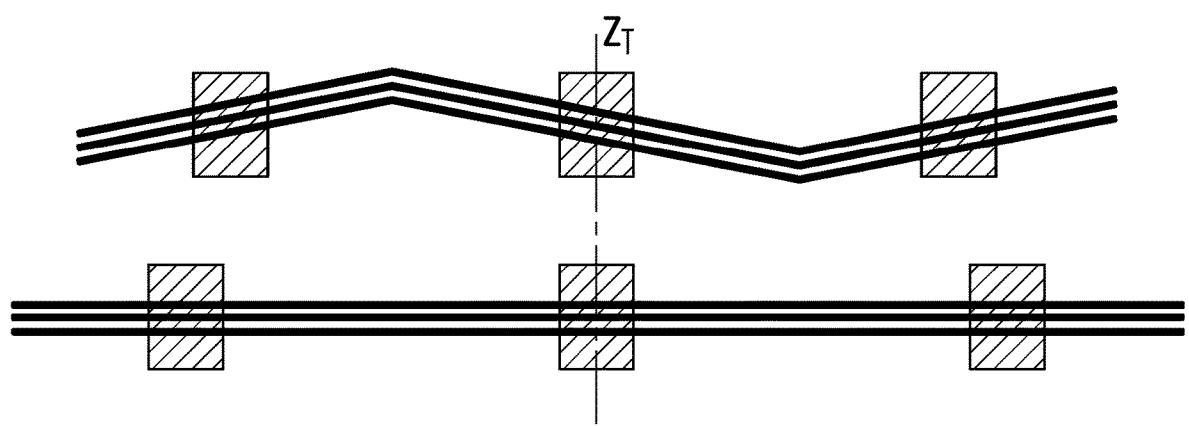
FIG. 11 depicts aspects of a projection of three pads of the expandable solenoid or loop coil.

FIG. 10 illustrates the embodiment when the solenoid or loop coil is fully deployed. Here, fully deployed means that the orientation of the current in the loop coil segments is in a plane perpendicular to the tool's xy-plane. However, there may be instances in which the solenoid or loop coil cannot be fully deployed. For example, when the coil is designed to be fully deployed in a 12-inch diameter borehole but is used in a 9-inch diameter borehole. This is illustrated in FIG. 11.

Here, the coil is illustrated as a 3-turn loop or solenoid. The lower illustration shows the coil in a fully deployed position with the current loops of the coil substantially tool's xy-plane. The upper illustration shows the coil when it is not fully deployed. In this case, the loops in each segment of the coil are out of the tool's xy-plane and form a "herringbone" pattern. While this is not an optimal arrangement, the coil will still create an RF field that is sufficiently perpendicular to the xy-plane to be able to perform NMR measurements in the resonant volume with sufficient sensitivity.

In this embodiment, the joints between coil segments can be rotating joints. However, the joints can be implemented as sliding and rotating joints combined. In this way, the coil could be deployed over a range of diameters with the coil loops substantially in the tool's xy-plane.

A fifth embodiment of the NMR tool in an opposed-pole configuration is now discussed.

Figure 12:
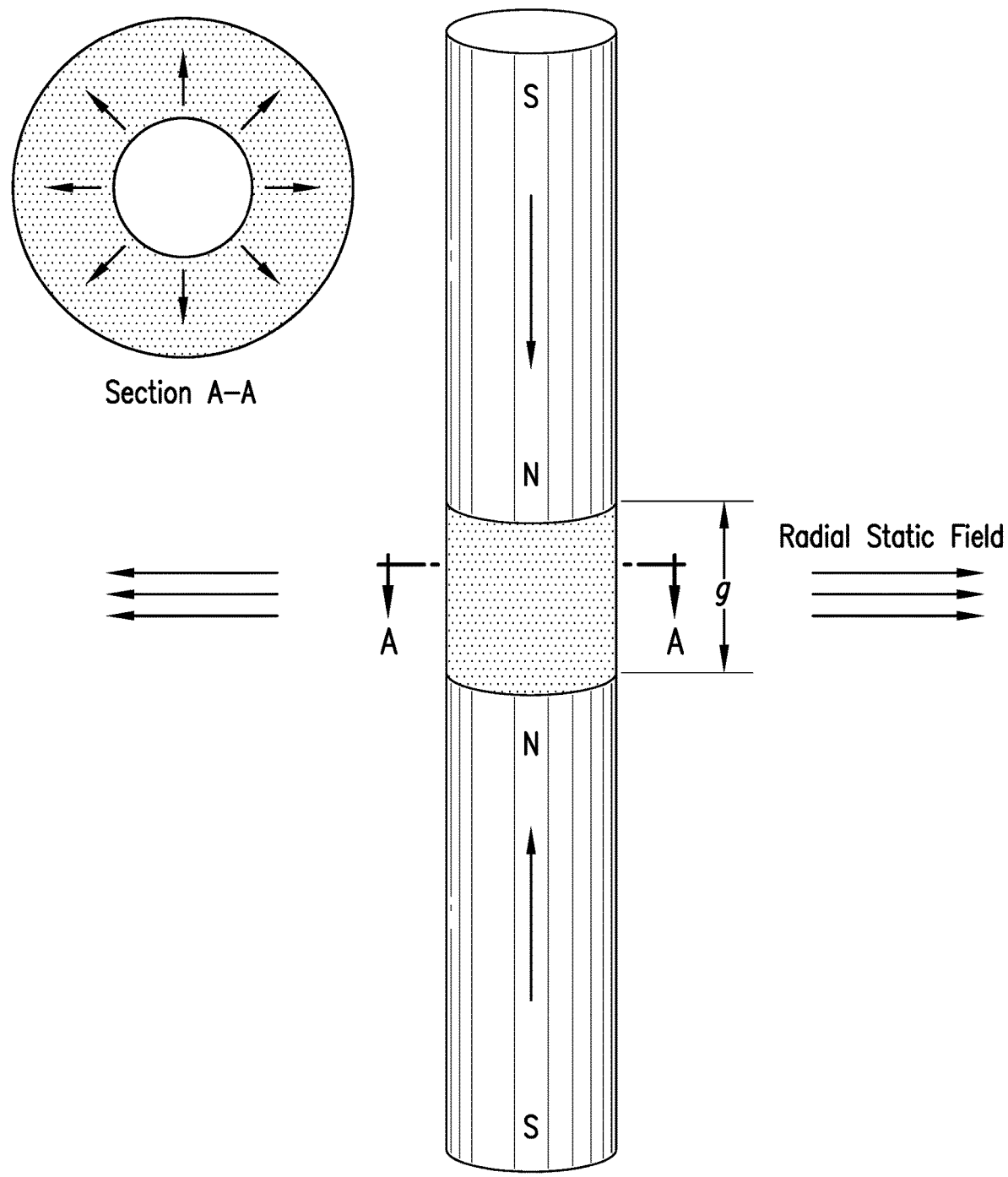
FIG. 12 depicts aspects of the NMR tool having a magnet with an opposed-pole configuration in a perspective view.
Figure 13:
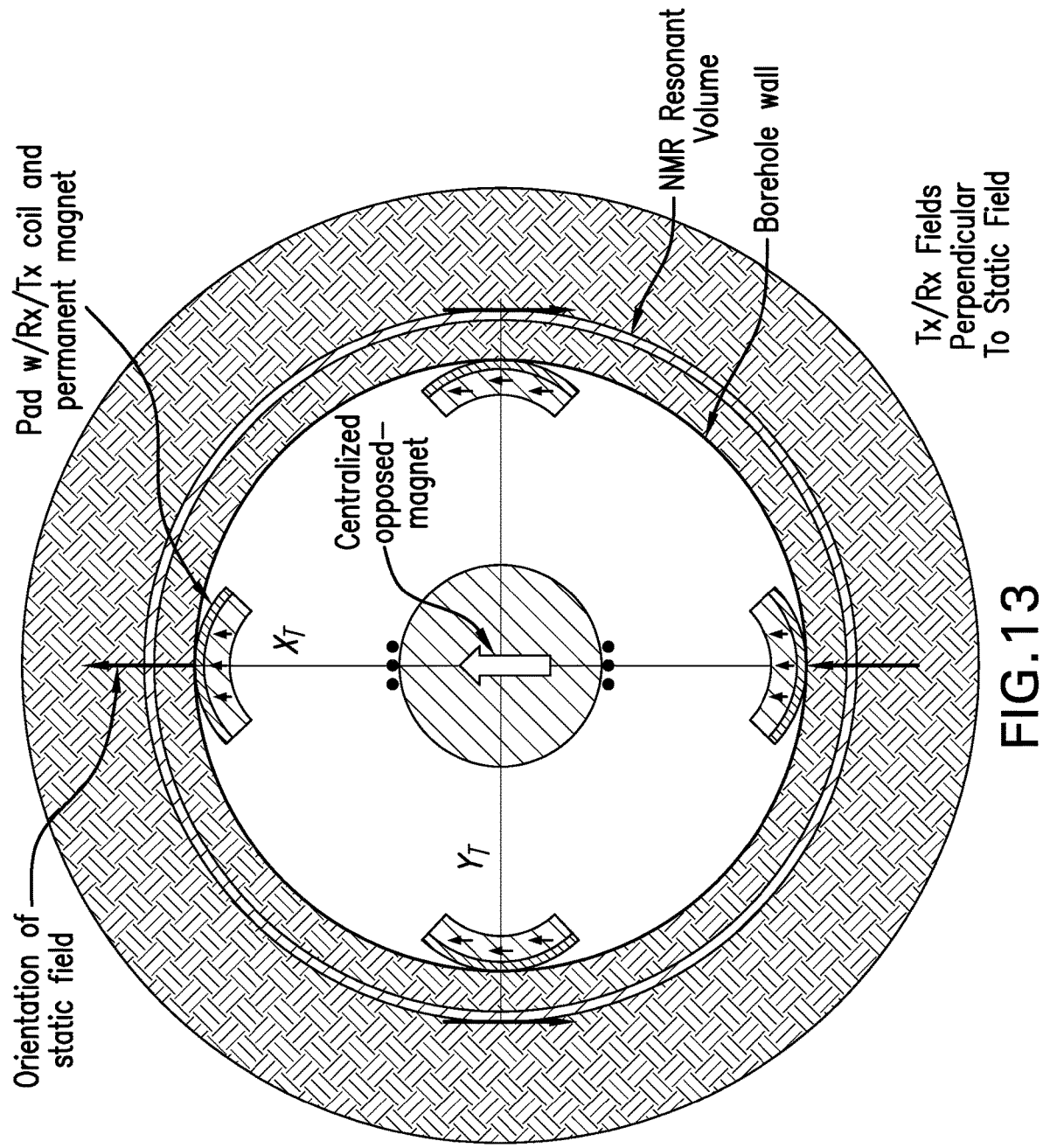
FIG. 13 depicts aspects of the opposed-pole configuration in the NMR tool in a top view.

In this embodiment, the permanent magnet array is arranged such that two cylindrical permanent magnets in a bar configuration are arranged such that the north or south poles of the two magnets are separated by a distance, g. This is illustrated in FIGS. 12 and 13. Two cylindrical magnets are shown with their north poles separated by a gap, g. The magnetic field in the reflection plane is radial as shown. Its magnitude depends on the size and strength of the magnets and the gap. While the figure shows only two magnets, the embodiment may contain other magnets with varying strength and orientation of the magnetization. An optional array of magnets and/or soft magnetic materials can be used to shape the field in the NMR sensitive volume. This produces a radial static field in the reflection plane of the device. The cross-section of one possible field-shaping array is shown in the upper-left.

In this embodiment, the expandable solenoid coil illustrated in FIG. 10 can be used to perform NMR in the sensitive volume. In addition, two butterfly coils (see for example FIG. 6) can be used. In this instance, only the two butterfly coils produce magnetic fields are orthogonal to the static field. The receive and transmit functions can be on separate coils. Alternatively, receive and transmit functions can be on one or both coils.

FIG. 13 illustrates in a top view another configuration in which the pads include a permanent magnet array where the magnetization is substantially in the radial direction. Transmit and receive coil configurations are a combination of the two butterfly coils shown in FIG. 6.

A sixth embodiment of the NMR tool having side-looking configurations is now discussed.

One side-looking embodiment is shown in FIG. 13. It uses knuckle joints and a bow spring to press the pad of the NMR tool up against the formation. The bow spring and mechanical arms can be sized to the appropriate length given the diameter of the borehole.

Many different magnet and antenna configurations can be used in this embodiment. One example is the transverse dipole magnet configuration as shown in FIG. 2. The magnetization of the magnet array is substantially perpendicular to the borehole axis and is oriented tangential or perpendicular to the borehole wall. All of these magnet configurations may contain soft magnetic materials to shape the static field for optimization. They can shape and thus enhance the sensitivity of the receive and transmit coils.

Appropriate receive and transmit coils are shown in FIG. 6. For example, in the tangential field case, the receive and transmit coils can be some combination of at least one loop coil and at least one butterfly coil oriented along the NMR tool's z-axis. In the perpendicular case, the receive and transmit coils would be at least one butterfly coil oriented along the NMR tool's z-axis and at least one butterfly coil oriented tangential to the borehole wall. Other types of coils may also be used that are be equally applicable to each magnet configuration.

While the basic opposed-pole configuration is implemented using a centralized magnet, shaping can be accomplished with the appropriate magnet array disposed within the gap as shown in FIGS. 12 and 13. The pad includes receive and transmit coils that are shown in FIG. 6 for example. The x-axis can be oriented either tangential to the borehole or along the axis of the borehole. FIG. 6 shows coils that may be used in various configurations such as butterfly coils that work in the opposed pole side-looking configuration. In a first embodiment, two separate butterfly coils, for receive and transmit functions, are used. In a second embodiment, two orthogonal receive butterfly coils and one transmit loop coil are used. (Alternatively, one receive coil and two orthogonal transmit coils can be used.) Finally, in a third embodiment, two orthogonal transmit and two orthogonal receive coils are used.

Figure 14:
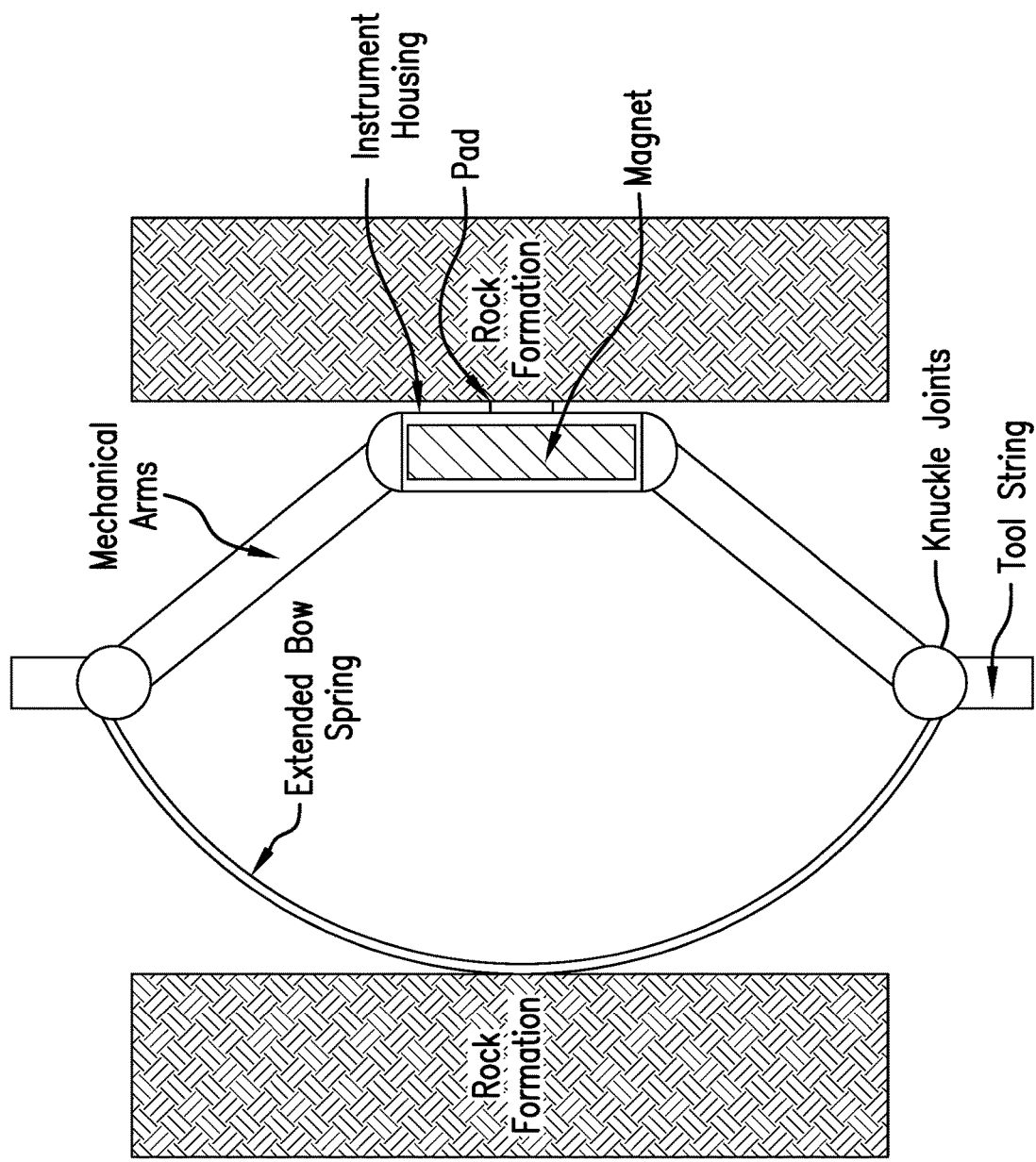
FIG. 14 depicts aspects of the NMR tool in a side-looking embodiment using a bow spring and knuckle joints.

Another configuration of a side-looking opposed pole configuration. A magnet array with its principle magnetization in the radial direction is included in a pad that is extended along with receive and transmit coils to be in contact with the borehole wall in this configuration. This configuration increases the static magnetic field in the formation and hence the sensitivity of the NMR measurement. The magnet arrays are shown in FIG. 14 and the coil configurations are shown in FIG. 6.

Figure 15:
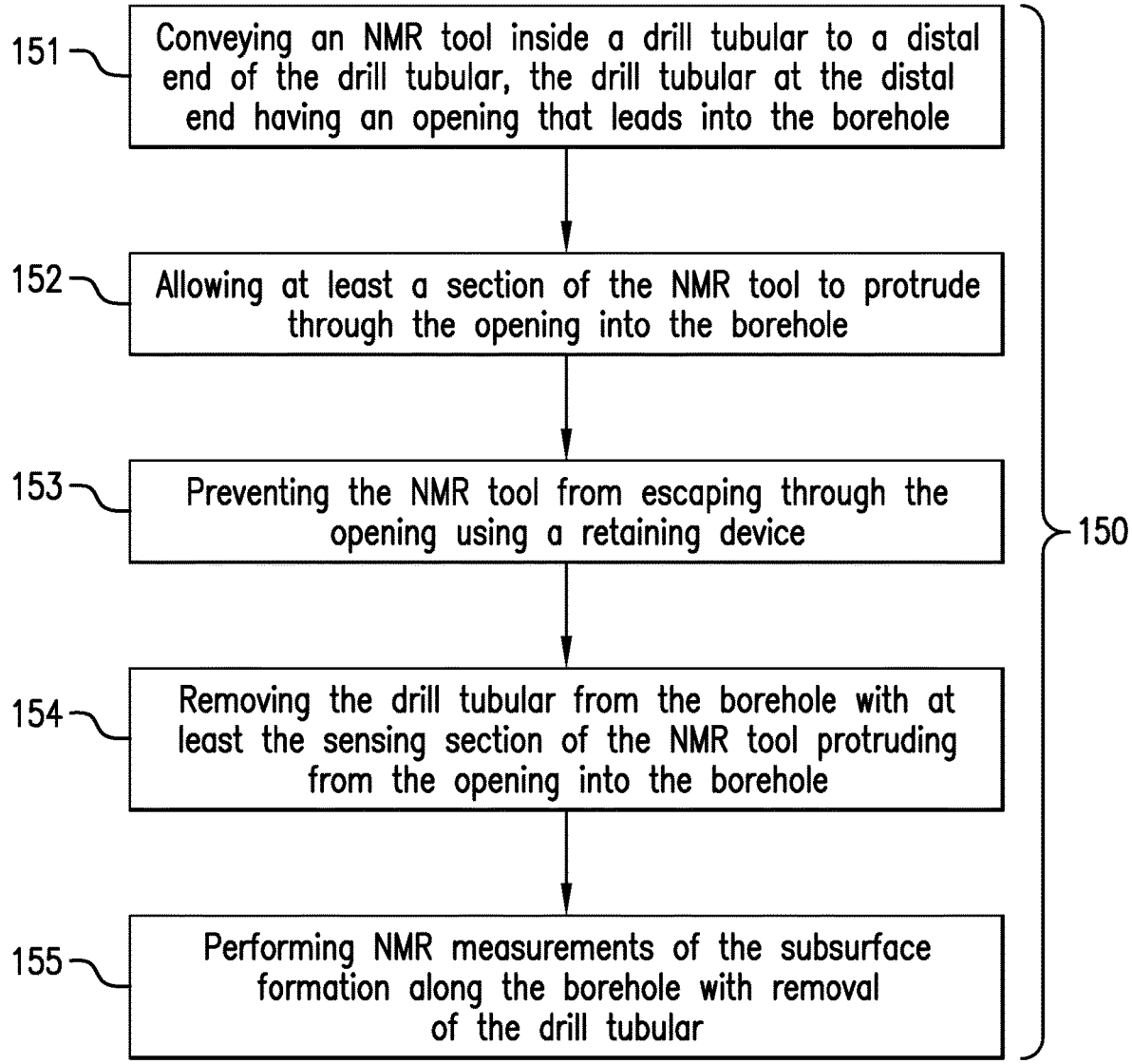
FIG. 15 is a flow chart for a method for a method for performing a nuclear magnetic resonance (NMR) measurement in a borehole penetrating a subsurface formation.

FIG. 15 is a flow chart for a method 150 for performing a nuclear magnetic resonance (NMR) measurement in a borehole penetrating a subsurface formation. Block 151 calls for conveying an NMR tool inside a drill tubular to a distal end of the drill tubular, the drill tubular at the distal end having an opening that leads into the borehole. In one or more embodiments, a drill bit for cutting or crushing formation rock includes the opening such that the interior of the drill tubular leads into the opening of the drill bit.

Block 152 calls for allowing at least a sensing section of the NMR tool to protrude through the opening into the borehole. The sensing section relates to a section of the NMR tool having at least those NMR components that need to be in the open borehole to perform NMR measurements on the subsurface formation. One example of components that need to be in the open borehole to perform NMR measurements on the subsurface formation include transmitter and receiver antennas and a static magnetic field source.

Block 153 calls for preventing the NMR tool from escaping through the opening using a retaining device. In one or more embodiments, the retaining device is integral to the NMR tool such that for example (a) the sensing section has an external diameter or dimension that is less than the inside diameter or dimension of the opening and (b) the remaining section of the NMR tool uphole of the sensing section has an external diameter or dimension that is greater than the inside diameter or dimension of the opening. Hence, in this configuration the sensing section is allowed to protrude through the opening into the open borehole while the remaining section is retained in the drill tubular and/or drill bit. In one or more embodiments, the retaining device may be a mechanical mechanism having for example a spring-loaded lever in the NMR tool that engages a recess in or near the opening. Other mechanical mechanisms may also be used.

Block 154 calls for removing the drill tubular from the borehole with at least the sensing section of the NMR tool protruding from the opening into the borehole.

Block 155 calls for performing NMR measurements of the subsurface formation along the borehole with removal of the drill tubular.

The method 150 may also include checking a health of the NMR tool using a wireline coupled to the NMR tool and disconnecting the wireline from the NMR tool prior to removing the drill tubular from the borehole. Checking the health of the NMR tool may include checking operation of electronic circuitry and components, checking charge level of a battery for supplying power to the NMR tool, and/or checking positions of actuators and arms to determine if they are deployed correctly. Checking the health of the NMR tool may also include checking that the NMR tool is properly positioned in the opening a such as by monitoring one or more position sensors disposed on the NMR tool.

In support of the teachings herein, various analysis components may be used, including a digital and/or an analog system. For example, the downhole electronics 13, NMR controller 14, and/or the computer processing system 15 may include digital and/or analog systems. The system may have components such as a processor, storage media, memory, input, output, communications link (wired, wireless, optical or other), user interfaces (e.g., a keyboard, display or printer), software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a non-transitory computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

Set forth below are some embodiments of the foregoing disclosure:

Embodiment 1: An apparatus for performing a nuclear magnetic resonance (NMR) measurement in a borehole penetrating a subsurface formation, the apparatus including: an NMR tool having an outside diameter that is less than an inside diameter of a drill tubular disposed in the borehole, the drill tubular having an opening at the distal end of the drill tubular leading into the borehole, a retaining device configured to allow at least a section of the NMR tool to protrude through the opening of the drill tubular and prevent an unrestrained release of the NMR tool through the opening, a magnet coupled to the NMR tool, a transmitter antenna coupled to the NMR tool and configured to transmit electromagnetic (EM) energy into the subsurface formation, and an extendable receiver antenna coupled to the NMR tool and configured to receive an NMR signal in response to transmitted EM energy to perform the NMR measurement.

Embodiment 2: The apparatus according to any prior embodiment, wherein the retaining device is coupled to or integral with the NMR tool and has a size that is greater than a size of the opening.

Embodiment 3: The apparatus according to any prior embodiment, wherein the retaining device includes a mechanical interlock.

Embodiment 4: The apparatus according to any prior embodiment, wherein the mechanical interlock is disposed on the NMR tool.

Embodiment 5: The apparatus according to any prior embodiment, further including a drill bit coupled to the drill tubular wherein the drill bit defines the opening.

Embodiment 6: The apparatus according to claim 1, wherein the drill tubular includes a drill string.

Embodiment 7: The apparatus according to any prior embodiment, wherein the drill tubular includes coiled tubing.

Embodiment 8: The apparatus according to any prior embodiment, wherein the magnet is a permanent magnet.

Embodiment 9. The apparatus according to any prior embodiment, wherein the permanent magnet includes an array of permanent magnets.

Embodiment 10: The apparatus according to any prior embodiment, wherein the array of permanent magnets includes an extendable array of permanent magnets.

Embodiment 11: The apparatus according to any prior embodiment, wherein the permanent magnet includes an extendable permanent magnet.

Embodiment 12: The apparatus according to any prior embodiment, wherein the transmitter antenna includes a coil having at least one loop of a conductor.

Embodiment 13: The apparatus according to any prior embodiment, wherein the transmitter antenna is an extendable transmitter antenna.

Embodiment 14: The apparatus according to any prior embodiment, wherein the transmitter antenna and the extendable receiver antenna are implemented as a transceiver antenna.

Embodiment 15: The apparatus according to any prior embodiment, wherein the extendable receiver antenna includes an extendable array of receiver antennas.

Embodiment 16: The apparatus according to any prior embodiment, wherein the extendable receiver antenna includes a coil having at least one loop of a conductor.

Embodiment 17: The apparatus according to any prior embodiment, wherein the coil includes multiple coils, each coil defining an area in which the area overlaps a portion of the areas defined by the other coils.

Embodiment 18: A method for performing a nuclear magnetic resonance (NMR) measurement in a borehole penetrating a subsurface formation, the method including: conveying an NMR tool inside a drill tubular to a distal end of the drill tubular, the drill tubular at the distal end having an opening that leads into the borehole, allowing at least a section of the NMR tool to protrude through the opening into the borehole, preventing the NMR tool from escaping through the opening using a retaining device, removing the drill tubular from the borehole with at least the sensing section of the NMR tool protruding from the opening into the borehole, and performing NMR measurements of the subsurface formation along the borehole with removal of the drill tubular.

Embodiment 19: The method according to any prior embodiment, further including: checking a health of the NMR tool using a wireline coupled to the NMR tool; and disconnecting the wireline from the NMR tool prior to removing the drill tubular from the borehole.

Embodiment 20: The method according to any prior embodiment, further including extending a receiver antenna from the NMR tool in response to the section of the NMR tool protruding through the opening.

Further, various other components may be included and called upon for providing for aspects of the teachings herein. For example, a power supply, magnet, electromagnet, sensor, electrode, transmitter, receiver, transceiver, antenna, controller, optical unit or components, electrical unit or electromechanical unit may be included in support of the various aspects discussed herein or in support of other functions beyond this disclosure.

Elements of the embodiments have been introduced with either the articles "a" or "an." The articles are intended to mean that there are one or more of the elements. The terms "including" and "having" and the like are intended to be inclusive such that there may be additional elements other than the elements listed. The conjunction "or" when used with a list of at least two terms is intended to mean any term or combination of terms. The term "configured" relates one or more structural limitations of a device that are required for the device to perform the function or operation for which the device is configured. The term "couple" and the like relates to direct coupling or indirect coupling using an intermediate device.

The flow diagram depicted herein is just an example. There may be many variations to this diagram or the steps (or operations) described therein without departing from the scope of the invention. For example, operations may be performed in another order or other operations may be performed at certain points without changing the specific disclosed sequence of operations with respect to each other. All of these variations are considered a part of the claimed invention.

The disclosure illustratively disclosed herein may be practiced in the absence of any element which is not specifically disclosed herein.

While one or more embodiments have been shown and described, modifications and substitutions may be made thereto without departing from the scope of the invention. Accordingly, it is to be understood that the present invention has been described by way of illustrations and not limitation.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for performing a nuclear magnetic resonance (NMR) measurement in a borehole penetrating a subsurface formation, the apparatus comprising:
   an NMR tool having an outside diameter that is less than an inside diameter of a drill tubular disposed in the borehole, the drill tubular being coupled to a drill bit, the NMR tool being conveyable through the drill tubular, the drill tubular having an opening at the distal end of the drill tubular leading into the borehole;
   a retaining device configured to allow at least a section of the NMR tool to protrude through the opening of the drill tubular and prevent an unrestrained release of the NMR tool through the opening;
   a magnet coupled to the NMR tool;
   a transmitter antenna coupled to the NMR tool and configured to transmit electromagnetic (EM) energy into the subsurface formation; and
   a receiver antenna coupled to the NMR tool and configured to receive an NMR signal in response to transmitted EM energy to perform the NMR measurement;
   wherein the transmitter antenna and/or the receiver antenna are extendable from the NMR tool.

2. The apparatus according to claim 1, wherein the retainer device is coupled to or integral with the NMR tool and has a size that is greater than a size of the opening.

3. The apparatus according to claim 1, wherein the retaining device comprises a mechanical interlock.

4. The apparatus according to claim 3, wherein the mechanical interlock is disposed on the NMR tool.

5. The apparatus according to claim 1, further comprising a drill bit coupled to the drill tubular wherein the drill bit defines the opening.

6. The apparatus according to claim 1, wherein the drill tubular comprises a drill string.

7. The apparatus according to claim 1, wherein the drill tubular comprises coiled tubing.

8. The apparatus according to claim 1, wherein the magnet is a permanent magnet.

9. The apparatus according to claim 8, wherein the permanent magnet comprises an array of permanent magnets.

10. The apparatus according to claim 9, wherein the array of permanent magnets comprises an extendable array of permanent magnets.

11. The apparatus according to claim 8, wherein the permanent magnet comprises an extendable permanent magnet.

12. The apparatus according to claim 1, wherein the transmitter antenna and the receiver antenna are implemented as a transceiver antenna.

13. The apparatus according to claim 1, wherein the transmitter antenna comprises an extendable array of transmitter antennas.

14. The apparatus according to claim 1, wherein the receiver antenna comprises an extendable array of receiver antennas.

15. The apparatus according to claim 1, wherein the transmitter antenna and/or the receiver antenna comprises a coil having at least one loop of a conductor.

16. The apparatus according to claim 15, wherein the coil comprises multiple coils, each coil defining an area in which the area overlaps a portion of the areas defined by the other coils.

17. The apparatus according to claim 15, where in the coil is at least one of a figure-8 coil or a butterfly coil.

18. A method for performing a nuclear magnetic resonance (NMR) measurement in a borehole penetrating a subsurface formation, the method comprising:
   conveying an NMR tool inside a drill tubular to a distal end of the drill tubular, the drill tubular being coupled to a drill bit, the drill tubular at the distal end having an opening that leads into the borehole;
   allowing at least a sensing section of the NMR tool to protrude through the opening into the borehole;
   preventing the NMR tool from escaping through the opening using a retaining device;
   removing the drill tubular from the borehole with at least the sensing section of the NMR tool protruding from the opening into the borehole; and
   performing NMR measurements of the subsurface formation along the borehole with removal of the drill tubular.

19. The method according to claim 18, further comprising:
   checking a health of the NMR tool using a wireline coupled to the NMR tool; and
   disconnecting the wireline from the NMR tool prior to removing the drill tubular from the borehole.

20. The method according to claim 18, further comprising extending a transmitter antenna and/or a receiver antenna from the NMR tool in response to the section of the NMR tool protruding through the opening.

* * * * *